United States Patent
Murphy

(10) Patent No.: US 9,997,232 B2
(45) Date of Patent: Jun. 12, 2018

(54) PROCESSING IN MEMORY (PIM) CAPABLE MEMORY DEVICE HAVING SENSING CIRCUITRY PERFORMING LOGIC OPERATIONS

(71) Applicant: Micron Technology, Inc., Boise, ID (US)

(72) Inventor: Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/066,831

(22) Filed: Mar. 10, 2016

(65) Prior Publication Data

US 2017/0263306 A1    Sep. 14, 2017

(51) Int. Cl.
G11C 11/4091    (2006.01)
G11C 11/4076    (2006.01)

(52) U.S. Cl.
CPC ...... *G11C 11/4091* (2013.01); *G11C 11/4076* (2013.01)

(58) Field of Classification Search
CPC .................. G11C 11/4091; G11C 11/4076
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

International Search Report and Written Opinion for related PCT Application No. PCT/US2017/020394, dated Mar. 2, 2017, 14 pages.

(Continued)

*Primary Examiner* — Anthan Tran
*Assistant Examiner* — Mushfique Siddique
(74) *Attorney, Agent, or Firm* — Brooks, Cameron & Huebsch, PLLC

(57) ABSTRACT

Apparatuses and methods are provided for logic/memory devices. An example apparatus comprises a plurality of memory components adjacent to and coupled to one another. A logic component is coupled to the plurality of memory components. At least one memory component comprises a memory device having an array of memory cells and sensing circuitry coupled to the array. The sensing circuitry includes a sense amplifier and a compute component. Timing circuitry is coupled to the array and sensing circuitry and configured to control timing of operations for the sensing circuitry. The logic component comprises control logic coupled to the timing circuitry. The control logic is configured to execute instructions to cause the sensing circuitry to perform the operations.

24 Claims, 10 Drawing Sheets

(56) References Cited

U.S. PATENT DOCUMENTS

| | | |
|---|---|---|
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,184,346 B1 | 2/2007 | Raszka et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |

(56) References Cited

U.S. PATENT DOCUMENTS

| | | |
|---|---|---|
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2002/0122332 A1 | 9/2002 | Kim |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0318764 A1 | 12/2010 | Greyzck |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Lerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Sec |
| 2014/0215185 A1 | 7/2014 | Danielsen |
| 2014/0244948 A1 | 8/2014 | Walker et al. |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1* | 12/2015 | Manning ............... G11C 7/08 365/189.15 |
| 2015/0357019 A1* | 12/2015 | Wheeler ............ G11C 11/4091 365/189.05 |
| 2015/0357020 A1 | 12/2015 | Manning |
| 2015/0357021 A1* | 12/2015 | Hush ................ G11C 11/4091 365/72 |
| 2015/0357022 A1* | 12/2015 | Hush ................ G11C 11/4074 365/72 |
| 2015/0357023 A1* | 12/2015 | Hush ................ G11C 11/4091 365/189.011 |
| 2015/0357024 A1* | 12/2015 | Hush ................ G11C 11/4091 365/72 |
| 2015/0357047 A1* | 12/2015 | Tiwari ............... G06F 9/30029 714/719 |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1* | 3/2016 | La Fratta ............... G11C 7/065 365/189.011 |
| 2016/0064047 A1 | 3/2016 | Tiwari |
| 2016/0125919 A1* | 5/2016 | Hush ................... G11C 7/065 365/205 |
| 2016/0225422 A1* | 8/2016 | Tiwari ..................... G11C 8/04 |
| 2016/0266873 A1* | 9/2016 | Tiwari ................ G11C 7/1006 |
| 2016/0267951 A1* | 9/2016 | Tiwari ............... G11C 11/4091 |
| 2016/0350230 A1* | 12/2016 | Murphy ............. G06F 12/0864 |
| 2016/0371033 A1* | 12/2016 | La Fratta ............ G06F 3/0655 |
| 2017/0228192 A1* | 8/2017 | Willcock .............. G11C 7/1006 |
| 2017/0262369 A1* | 9/2017 | Murphy .............. G06F 12/0808 |
| 2017/0269865 A1* | 9/2017 | Willcock ............. H04N 19/186 |
| 2017/0277440 A1* | 9/2017 | Willcock .............. G06F 3/0611 |
| 2017/0277581 A1* | 9/2017 | Lea ................... G06F 11/073 |
| 2017/0278559 A1* | 9/2017 | Hush ................ G11C 11/4091 |

(56) References Cited

U.S. PATENT DOCUMENTS

| | | | | |
|---|---|---|---|---|
| 2017/0278584 | A1* | 9/2017 | Rosti | G11C 29/38 |
| 2017/0364439 | A1* | 12/2017 | Wheeler | G11C 11/4091 |
| 2017/0365299 | A1* | 12/2017 | Hush | G11C 11/4093 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Office Action for related Taiwan Patent Application No. 106108064, dated Jan. 22, 2018, 18 pages.

\* cited by examiner

| A (844) | B (845) | NOT OPEN (856) | OPEN TRUE (870) | OPEN INVERT (871) |
|---|---|---|---|---|
| 0 | 0 | 0 | 0 | 1 |
| 0 | 1 | 0 | 1 | 0 |
| 1 | 0 | 1 | 0 | 1 |
| 1 | 1 | 1 | 1 | 0 |

875 (swap)

8-2

| | | A | A*B | A*B̄ | A+B | B | AXB | A+B̄ | ĀXB | B̄ |
|---|---|---|---|---|---|---|---|---|---|---|
| FF | | 0 | 0 | 0 | 0 | 0 | 0 | 1 | 1 | 1 | ← 876
| FT | | 0 | 0 | 0 | 1 | 1 | 1 | 0 | 0 | 0 | ← 877
| TF | | 0 | 0 | 1 | 0 | 0 | 1 | 0 | 0 | 1 | ← 878
| TT | | 0 | 1 | 0 | 0 | 1 | 0 | 0 | 1 | 0 | ← 879
| A | B | A | A*B | A*B̄ | A+B | B | AXB | A+B̄ | ĀXB | B̄ | ← 847
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

{876–879} = 880

PROCESSING IN MEMORY (PIM) CAPABLE MEMORY DEVICE HAVING SENSING CIRCUITRY PERFORMING LOGIC OPERATIONS

TECHNICAL FIELD

The present disclosure relates generally to semiconductor memory and methods, and more particularly, to apparatuses and methods for logic/memory devices.

BACKGROUND

Memory devices are typically provided as internal, semiconductor, integrated circuits in computers or other computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource (e.g., CPU) can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing device and/or system.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array). A PIM device may save time by reducing and/or eliminating external communications and may also conserve power.

BRIEF DESCRIPTION OF THE DRAWINGS

FIG. 8 is a logic table illustrating selectable logic operation results implemented by a sensing circuitry shown in FIG. 3 in accordance with a number of embodiments of the present disclosure.

DETAILED DESCRIPTION

Figure 1:
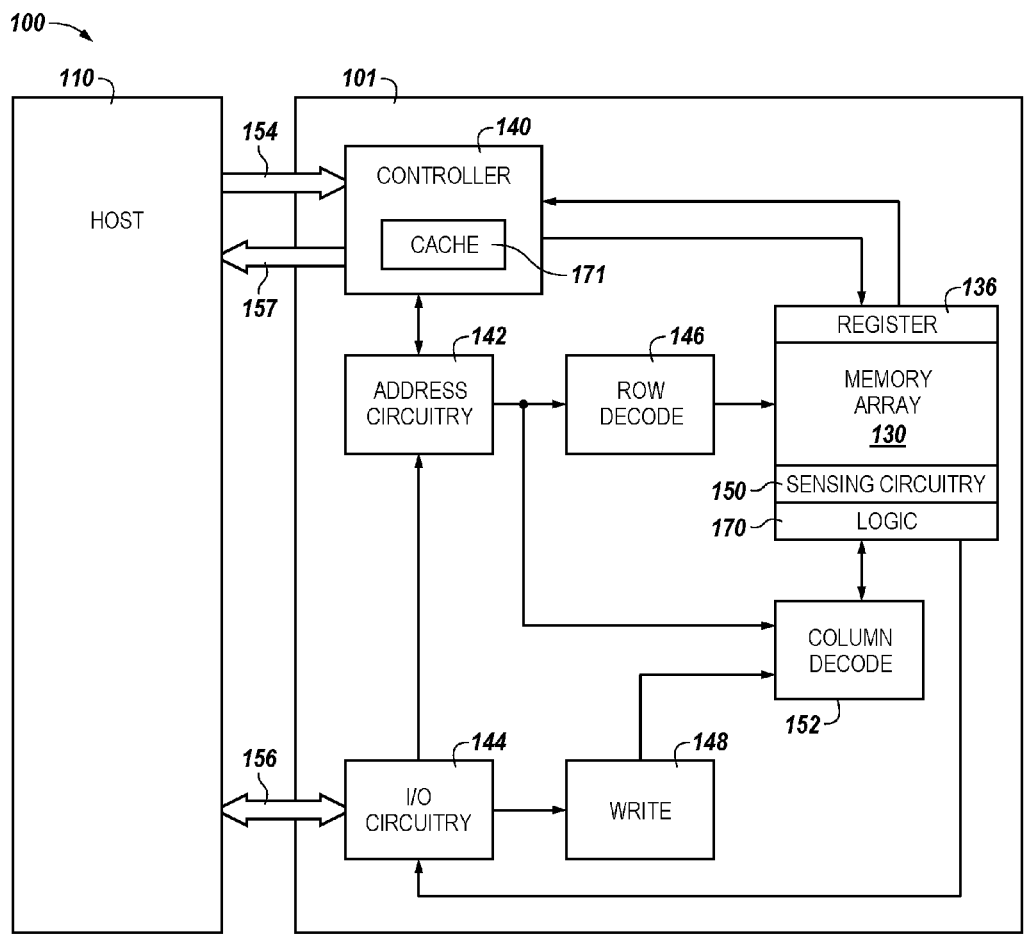
FIG. 1 is a block diagram of an apparatus in the form of a computing system including one example of a processing in memory (PIM) capable device coupled to a host.

The present disclosure includes apparatuses and methods for logic/memory device. In one example embodiment, execution of logical operations is performed on both one or more memory components and a logical component to a logic/memory device.

An example apparatus comprises a plurality of memory components adjacent to and coupled to one another. A logic component is coupled to the plurality of memory components. At least one memory component comprises a partitioned portion having an array of memory cells and sensing circuitry coupled to the array. The sensing circuitry includes a sense amplifier and a compute component configured to perform operations. Timing circuitry is coupled to the array and sensing circuitry to control timing of operations for the sensing circuitry. The logic component comprises control logic coupled to the timing circuitry. The control logic is configured to execute instructions to perform operations with the sensing circuitry.

The logic component may comprise logic that is partitioned among a number of separate logic/memory devices (also referred to as "partitioned logic") and which is coupled to timing circuitry for a given logic/memory device. The partitioned logic on a logic component at least includes control logic that is configured to execute instructions to cause operations to be performed on one or more memory components. At least one memory component includes a portion having sensing circuitry associated with an array of memory cells. The array may be a dynamic random access memory (DRAM) array and the operations can include logical AND, OR, and/or XOR Boolean operations. The timing circuitry and the control logic may be in different clock domains and operate at different clock speeds. The timing circuitry is separate from other control registers, e.g., double data rate (DDR) registers, used to control read and write access requests for the array, e.g., in a DRAM array.

In some embodiments, a logic/memory device allows input/output (I/O) channel and processing in memory (PIM) control over a bank or set of banks allowing logic to be partitioned to perform logical operations between a memory (e.g., dynamic random access memory (DRAM)) component and a logic component. Through silicon vias (TSVs) may allow for additional signaling between a logic layer and a DRAM layer. Through silicon vias (TSVs) as the term is used herein is intended to include vias which are formed entirely through or partially through silicon and/or other single, composite and/or doped substrate materials other than silicon. Embodiments are not so limited. With enhanced signaling, a PIM operation may be partitioned between components, which may further facilitate integration with a logic component's processing resources, e.g., an embedded reduced instruction set computer (RISC) type processing resource and/or memory controller in a logic component.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including one example of a processing in memory (PIM) capable device 101 coupled to a host 110. The PIM capable device 101 (also referred to as "memory device 101") may include a controller 140. FIG. 1 is provided as an example of a system including a current PIM capable device 101 architecture. As will be described in connection with the embodiments shown in FIGS. 3A-5B, one or more of the functions of the controller 140 discussed in connection with FIG. 1 may be partitioned between a plurality of memory components and one or more logic components to form different logic/memory device architectures.

As shown in the example of FIG. 1, the memory device 101 may include a memory array 130, registers 136, sensing circuitry 150, and additional logic circuitry 170. The system 100 can include separate integrated circuits or both the logic and memory can be on the same integrated device as with a system on a chip (SoC). The system 100 can be, for instance, a server system and/or a high performance computing (HPC) system and/or a portion thereof.

For clarity, the system 100 has been simplified to focus on features with relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory component 101 may include a number of arrays 130 (e.g., a number of banks of DRAM cells, NAND flash cells, etc.).

The memory device 101 includes address circuitry 142 to latch address signals provided over a data bus 156 (e.g., an I/O bus) through I/O circuitry 144. Status and/or exception information can be provided from the controller 140 on the memory device 101 to a host 110 and/or logic component through an out-of-band bus 157. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130. Address, control and/or commands, e.g., processing in memory (PIM) commands, may be received to the controller 140 via bus 154.

Registers 136 may include control registers, e.g., double data rate (DDR) control registers in a DRAM, to control the operation of the array 130, e.g., DRAM array, and/or controller 140. As such, the registers 136 may be coupled to the I/O circuitry 144 and/or controller 140. In various embodiments the registers 136 may be memory mapped I/O registers 136. The memory mapped I/O registers 136 can be mapped to a plurality of locations in memory where microcode instructions are stored.

In various embodiments, controller 140 may decode signals received via bus 154 from the host 110. These signals can include chip enable signals, write enable signals, and address latch signals that are used to control operations performed on the memory array 130, including data read, data write, and data erase operations. In one or more embodiments, portions of the controller 140 can be a reduced instruction set computer (RISC) type controller operating on 32 and/or 64 bit length instructions. In various embodiments, the controller 140 is responsible for executing instructions from the host 110 and/or logic components in association with the sensing circuitry 150 to perform logical Boolean operations such as AND, OR, XOR, etc. Further, the controller 140 can control shifting data (e.g., right or left) in an array, e.g., memory array 130. Additionally, portions of the controller 140 can include a state machine, a sequencer, or some other type of controller, described further in connection with FIG. 2.

Examples of the sensing circuitry 150 and its operations are described further below in connection with FIGS. 6-8. In various embodiments the sensing circuitry 150 can comprise a plurality of sense amplifiers and a plurality of compute components, which may serve as and be referred to herein as an accumulator, and can be used to perform logical operations (e.g., on data associated with complementary data lines).

In various embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processing resource associated with host 110 and/or other processing circuitry, such as ALU circuitry, located on memory device 101 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array 130. Additional peripheral sense amplifiers, extended row address (XRA) registers, cache and/or data buffering, e.g., additional logic circuitry 170, can be coupled to the sensing circuitry 150 and can be used to store, e.g., cache and/or buffer, results of operations described herein.

Thus, in various embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., on host 110). For instance, processing resources on host 110 and/or sensing circuitry 150 on memory device 101 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

Figure 2:
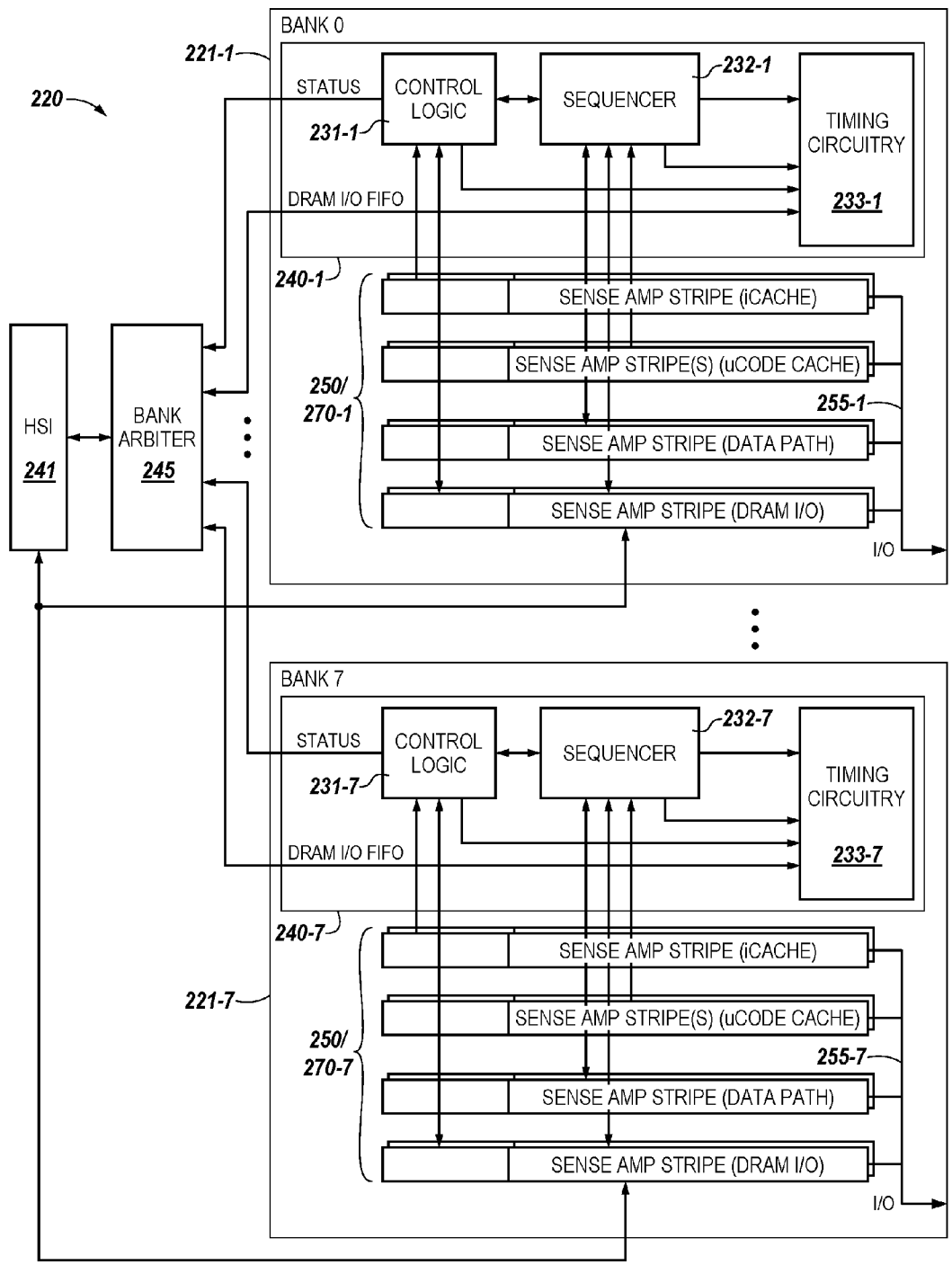
FIG. 2 is another block diagram in greater detail of a portion of one example of a PIM capable device.

FIG. 2 is another block diagram in greater detail of a portion of one example of a PIM capable device 220 such as memory device 101 in FIG. 1. In the example of FIG. 2, a controller 240-1, . . . , 240-7 (referred to generally as controller 240) may be associated with each bank 221-1, . . . , 221-7 (referred to generally as 221) to the PIM capable device 220. Eight banks are shown in the example of FIG. 2. However, embodiments are not limited to this example number. Controller 240 may represent controller 140 shown in FIG. 1. Each bank may include one or more arrays of memory cells (not shown). For example each bank may include one or more arrays such as array 130 in FIG. 1 and can include decoders, other circuitry and registers shown in FIG. 1. In the example PIM capable device 220 shown in FIG. 2, controllers 240-1, . . . , 240-7 are shown having control logic 231-1, . . . , 231-7, sequencers 232-1, . . . , 232-7, and timing circuitry 233-1, . . . , 233-7 as part of a controller 240 on one or more memory banks 221 of a memory device 220. The PIM capable device 220 may represent part of memory device 101 shown in FIG. 1.

As shown in the example of FIG. 2, the PIM capable device 220 may include a high speed interface (HSI) 241 to receive data, addresses, control signals, and/or commands at the PIM capable device 220. In various embodiments, the HSI 241 may be coupled to a bank arbiter 245 associated with the PIM capable device 220. The HSI 241 may be configured to receive commands and/or data from a host, e.g., 110 as in FIG. 1. As shown in the example of FIG. 2, the bank arbiter 245 may be coupled to the plurality of banks 221-1, . . . , 221-7.

In the example shown in FIG. 2, the control logic 231-1, . . . , 231-7 may be in the form of a microcoded engine responsible for fetching and executing machine instructions, e.g., microcode instructions, from an array of memory cells, e.g., an array as array 130 in FIG. 1, that is part of each bank 221-1, . . . , 221-7 (not detailed in FIG. 2). The sequencers 232-1, . . . , 232-7 may also be in the form of microcoded engines. Alternatively, the control logic 231-1, . . . , 231-7 may be in the form of a very large instruction word (VLIW) type processing resource and the sequencers 232-1, . . . , 232-7, and the timing circuitry 233-1, . . . , 233-7 may be in the form of state machines and transistor circuitry.

The control logic 231-1, . . . , 231-7 may decode microcode instructions into function calls, e.g., microcode function calls (uCODE), implemented by the sequencers 232-1, . . . , 232-7. The microcode function calls can be the operations that the sequencers 232-1, . . . , 232-7 receive and execute to cause the PIM device 220 to perform particular logical operations using the sensing circuitry such as sensing circuitry 150 in FIG. 1. The timing circuitry 233-1, . . . , 233-7 may provide timing to coordinate performance of the logical operations and be responsible for providing conflict free access to the arrays such as array 130 in FIG. 1.

As described in connection with FIG. 1, the controllers 240-1, . . . , 240-7 may be coupled to sensing circuitry 150 and/or additional logic circuitry 170, including cache, buffers, sense amplifiers, extended row address (XRA) latches, and/or registers, associated with arrays of memory cells via control lines and data paths shown in FIG. 2 as 255-1, 255-7. As such, sensing circuitry 150 and logic 170 shown in FIG.

1 can be associated to the arrays of memory cells 130 using data I/Os shown as 255-1, . . . , 255-7 in FIG. 2. The controllers 240-1, . . . , 240-7 may control regular DRAM operations for the arrays such as a read, write, copy, and/or erase operations, etc. Additionally, however, microcode instructions retrieved and executed by the control logic 231-1, . . . , 231-7 and the microcode function calls received and executed by the sequencers 232-1, . . . , 232-7 cause sensing circuitry 150 shown in FIG. 1 to perform additional logical operations such as addition, multiplication, or, as a more specific example, Boolean operations such as an AND, OR, XOR, etc., which are more complex than regular DRAM read and write operations. Hence, in this PIM capable device 220 example, microcode instruction execution and logic operations are performed on the banks 221-1, . . . , 221-7 to the PIM device 220.

As such, the control logic 231-1, . . . , 231-7, sequencers 232-1, . . . , 232-7, and timing circuitry 233-1, . . . , 233-7 may operate to generate sequences of operation cycles for a DRAM array. In the PIM capable device 220 example, each sequence may be designed to perform operations, such as a Boolean logic operations AND, OR, XOR, etc., which together achieve a specific function. For example, the sequences of operations may repetitively perform a logical operation for a one (1) bit add in order to calculate a multiple bit sum. Each sequence of operations may be fed into a first in/first out (FIFO) buffer coupled to the timing circuitry 233-1, . . . , 233-7 to provide timing coordination with the sensing circuity 150 and/or additional logic circuitry 170 associated with the array of memory cells 130, e.g., DRAM arrays, shown in FIG. 1.

In the example PIM capable device 220 shown in FIG. 2, the timing circuitry 233-1, . . . , 233-7 provides timing and provides conflict free access to the arrays from four (4) FIFO queues. In this example, one FIFO queue may support array computation, one may be for Instruction fetch, one for microcode (e.g., Ucode) instruction fetch, and one for DRAM I/O. Both the control logic 231-1, . . . , 231-7 and the sequencers 232-1, . . . , 232-7 can generate status information, which is routed back to the bank arbiter 245 via a FIFO interface. The bank arbiter 245 may aggregate this status data and report it back to a host 110 via the HSI 241.

Figure 3A:
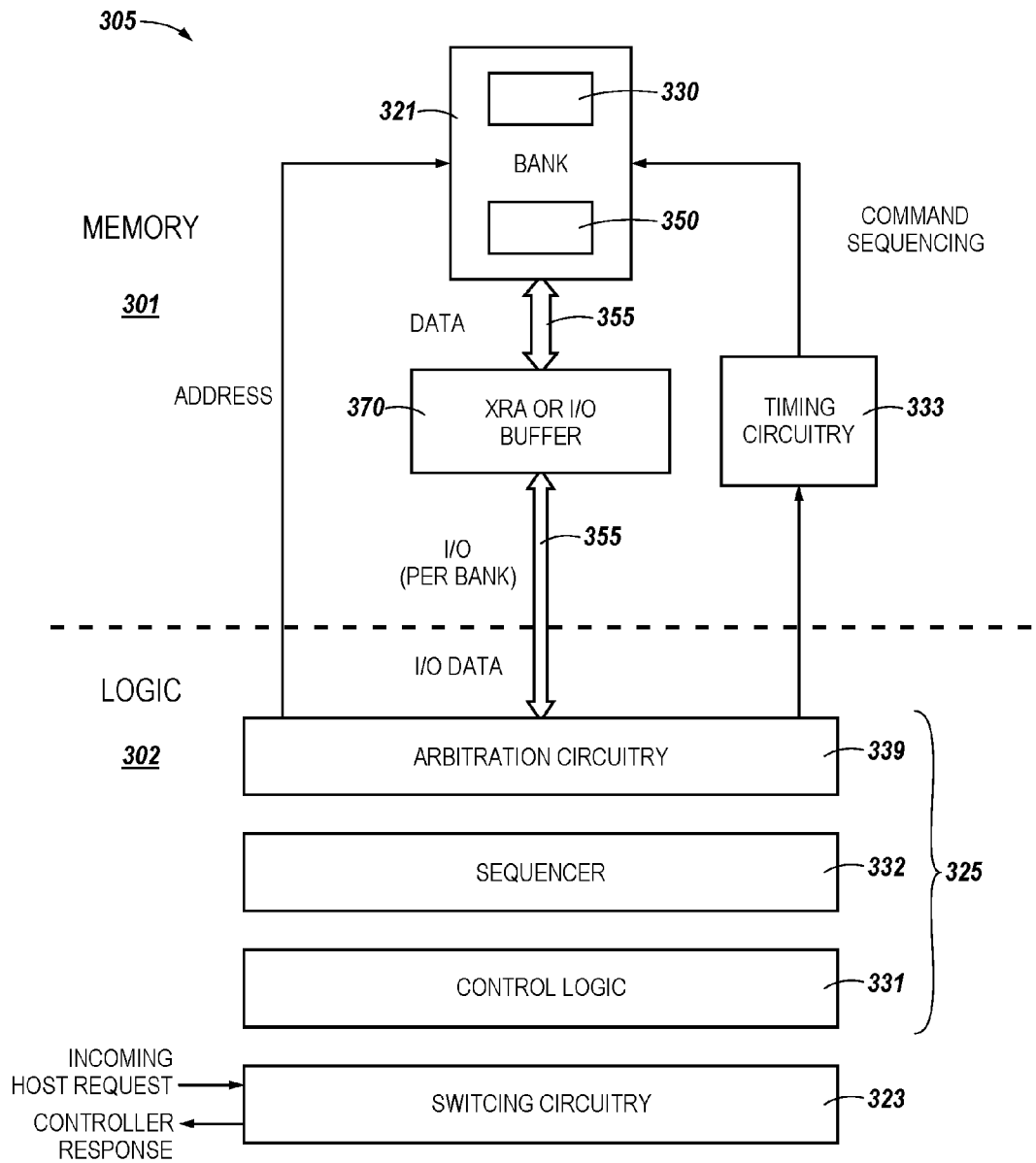
FIG. 3A is a block diagram of a logic/memory device having logic shared between a memory component and a logic component in accordance with a number of embodiments of the present disclosure.
Figure 3B:
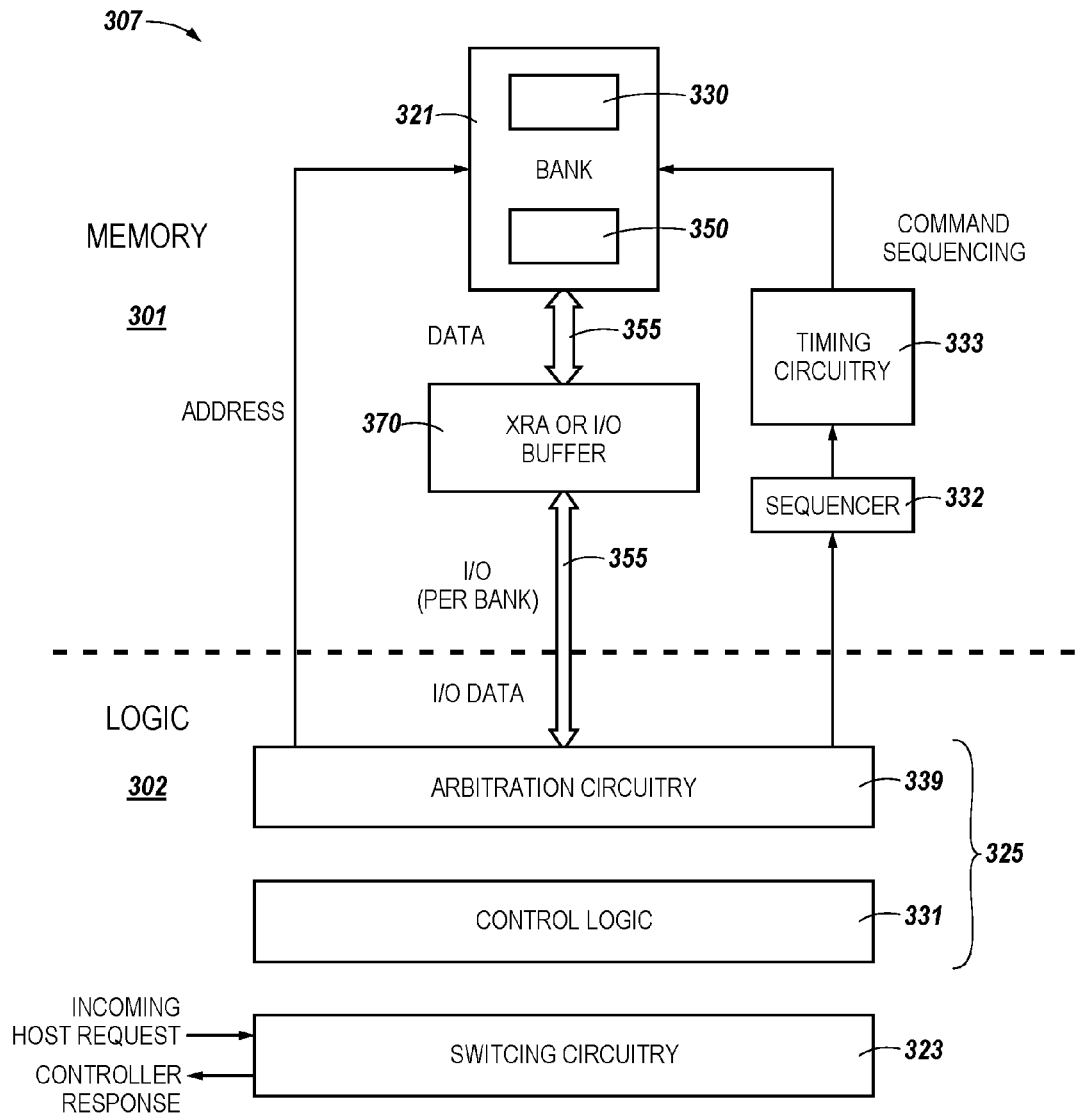
FIG. 3B is another block diagram of a logic/memory device having logic shared between a memory component and a logic component in accordance with a number of embodiments of the present disclosure.
Figure 4:
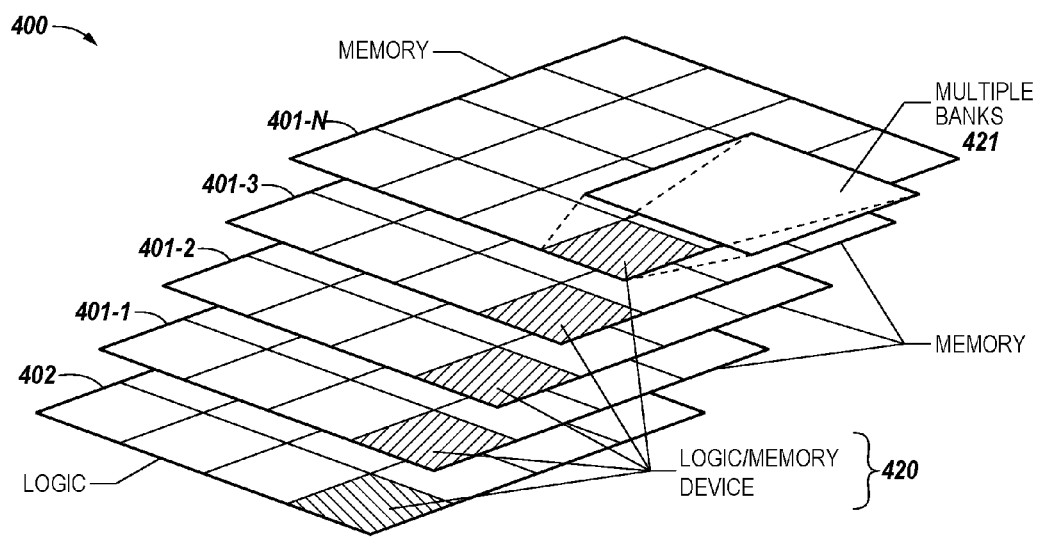
FIG. 4 illustrates a representation of a computing system in accordance with a number of embodiments of the present disclosure.

FIGS. 3A and 3B are block diagrams of logic/memory devices 305 and 307 in accordance with a number of embodiments of the present disclosure. The logic/memory device embodiments 305 and 307 illustrate logic partitioned (also referred to as "partitioned logic") between a memory component 301 and a logic component 302. The logic/memory device embodiments 305 and 307 may be a part of a 3D logic/memory device stack as shown in FIG. 4 and may include I/O channels 355 coupling the memory components 301 to the logic components 302.

In some embodiments the I/O channels may be in the form of through silicon vias (TSVs). The TSVs may be formed either entirely or partially through silicon or other single, composite and/or doped substrate material to the components. Such TSV technology allows for additional signaling between a logic component 302 and one or more memory components 301. Given enhanced signaling through TSVs, PIM capable device controller operation, like that shown as 240 in FIG. 2, can be partitioned between a logic component 302 and memory components 301 of a 3D logic/memory device stack.

In the example embodiments of FIGS. 3A and 3B control logic 331 (representing the control logic structure and functions described in connection with 231 in FIG. 2) may be located on the logic component 302 to enhance and facilitate close integration with the processing resources of one or more hosts such as hosts 510 discussed in FIGS. 5A and 5B in a distributed computing system and/or in system on chip (SoC) environment.

FIG. 2 provided a PIM device 220 example in which the controller 240 was described having three parts; control logic, sequencer and timing circuitry. In that example the timing circuitry 233 and the sequencer 232 were described as relatively small state machines and the control logic 231 was described as being a microcoded engine.

FIG. 3A illustrates an example logic/memory device 305 embodiment in which both the control logic 331 and the sequencer 332 are located on the logic component 302 of the logic/memory device 305, but still coupled to the one or more memory components 301 via high speed I/O channel 355. As noted above, the control logic 331 may be in the form of a microcoded engine such as an embedded, reduced instruction set computer (RISC) type controller and the sequencer 332 may be in the form of a state machine.

Alternatively, both the control logic 331 and the sequencer 332 may be in the form of microcoded engines. As used herein, an engine is intended to include hardware and may include software and/or firmware, but at least includes hardware, e.g., circuitry in the form of an application specific integrated circuit (ASIC). For example, in current generation processing in memory (PIM) devices, microcode may be used and executed on the PIM device by a reduced instruction set computer (RISC) type controller, ASIC, etc. A RISC type controller is one of a family of processors which operates on a reduced bit length instruction, e.g., a 32 or 64 bit length instruction. Thus, as used herein, reference to microcode instructions on a PIM capable device is intended to include a 32 or 64 bit length instruction. However, embodiments may include other bit length instructions.

Thus, in various embodiments, execution of microcode instructions for PIM capable logic/memory devices 305 and 307 is performed by logic component 302, separate from a host 110 as shown in FIG. 1 and also separate from the memory component 301. In both the embodiments of FIGS. 3A and 3B, the timing circuitry 333 is remains with the memory component 301. As used herein the timing circuitry 333 on the memory component 301 may be referred to as "first partitioned logic". The timing circuitry 333 can represent the timing circuitry 233 describe with the PIM capable device 220 in FIG. 2. In such embodiments, the control logic 331 and the sequencer 332 may be configured to execute particularly developed firmware, e.g., particular purpose PIM microcode, on the logic component 302.

The embodiment of FIG. 3B illustrates an embodiment of the present disclosure in which the control logic 331 is located on the logic component 302 of the logic/memory device 307, but both the sequencer 332 and the timing circuity 333 remain on the memory component 301. In the embodiment of FIG. 3B where both the sequencer 332 and the timing circuitry 333 are located on the memory component 301, the sequencer 332 and the timing circuitry 333 may be referred to as the "first partitioned logic" as being located on the memory component 301. The control logic 331 is still coupled to the memory component 301 via high speed I/O channel 355. The sequencer 332 and timing circuitry 333 may represent timing circuitry 233 and sequencer 232 as described in connection with FIG. 2.

In the example embodiment of FIG. 3B, the timing circuitry 333 and sequencer 332 on the memory component 301 may both be state machines to provide timing and control command sequencing, respectively. Thus, the timing circuitry 333 and sequencer 332 may be compact yet be responsible for providing conflict free access to arrays, e.g., DRAM arrays, and/or sensing circuitry, such as array 130 and sensing circuitry 150 in FIG. 1, for logical operations performed on a bank 321. The sequencer 332 and timing circuitry 333 are separate from the control registers 136 used in normal DRAM logical operations such as read, write, copy, and/or move DRAM array operations.

As shown in the embodiments of FIGS. 3A and 3B, the memory component 301 of the logic/memory devices 305 and 307 may contain one or more banks 321. The banks 321 may contain an array of memory cells 330 and sensing circuitry 350 coupled thereto. The array 330 and sensing circuitry 350 may represent array 130 and sensing circuitry 150 described in connection with FIG. 1. Embodiments of the sensing circuitry 350 are described in more detail in connection with FIGS. 6-8. Additionally, in the embodiments of FIGS. 3A and 3B, the memory component 301 of the logic/memory devices 305 and 307 may include additional circuitry in the form of I/O buffers and/or extend row address (XRA) registers, row address strobe (RAS) logic, etc. 370. This additional logic circuitry 370 may represent addition logic circuitry 170 described in FIG. 1.

As shown in the example embodiments of FIGS. 3A and 3B, the logic component 302 can include switching circuitry 323 to provide routing across arrays 330 associated with one or more banks 321. In some embodiments, the switching circuitry 330 may replace or perform at least some of the functions of the HSI 241 described in connection with FIG. 2.

In the example embodiments of FIGS. 3A and 3B, placing at least the control logic 331 on the logic component 302 of the logic/memory devices 305 and 307 may allow for higher speed device operation by facilitating tight integration to a host processing resource such as host 110 shown in FIG. 1 and/or host device(s) 510 shown and described in connection with FIGS. 5A and 5B. As used herein the control logic 331 on the logic component 302 may be referred to as "second partitioned logic". In the embodiment of FIG. 3A, where both the control logic 331 and sequencer 332 are located on the logic component 302, the control logic and the sequencer 332 may collectively be referred to as the "second partitioned logic" as being located on the logic component 302. In some embodiments, coordinated caching on the logic component 302 with the one or more memory components 301 of the logic/memory devices 305 and 307 may be achieved. Further, improved integration with existing cache coherency protocols to separate hosts, such as host 110 in FIG. 1 and/or host device(s) shown in FIGS. 5A and 5B, may be achieved both closely as part of control logic 331 and/or more loosely with switching circuitry 323 and I/Os 355 (e.g., such as exists with a client on a symmetric multiprocessing (SMP)-capable bus).

The example embodiments shown in FIGS. 3A and 3B can facilitate direct memory access (DMA) functionality both inter-bank and intra-bank to one or more banks 321. Further, the logic/memory device embodiments 305 and 307 may allow for a lower latency to be achieved with PIM command routing operations. The same may be achieved even with the timing circuitry 333 of the memory component 301 operating in a different clock domain and/or at a different clock speed than a clock domain and/or clock speed of the control logic 331 on the logic component 302.

According to the example embodiments of FIGS. 3A and 3B, the logic component 302 can include arbitration circuitry 339. The arbitration circuitry is configured to apply a scheduling policy that prioritizes between normal DRAM requests and PIM requests, e.g., PIM commands, for use of array 300 that are received at the logic component 302 by the switching circuitry 323 and/or control logic 331. In the embodiment of FIG. 3A, the arbitration circuitry 339 may be formed as an integrated circuit with the control logic 331 and sequencer 332 to collectively form logic 325 on the logic component 302 of logic/memory device 305. In this example, the logic 325 may represent the partitioned logic 525 on the logic component 502 of a logic/memory device 520 shown and described in the embodiment of FIG. 5A. In the embodiment of FIG. 3B, the arbitration circuitry 339 may be formed as an integrated circuit with the control logic 331 to collectively form logic 325 on the logic component 302 of logic/memory device 307. In this example the logic 325 may represent the partitioned logic 525 on the logic component 502 of a logic/memory device 520 shown and described in the embodiment of FIG. 5B.

The scheduling policies implemented by the arbitration circuitry may be according to an all, some, or none set of rules for prioritizing between DRAM requests and PIM requests received at a logic component 302 for use of an array 330 and/or sensing circuitry 350 of a bank 321 on a memory component 301. For example, one policy may allow a DRAM request received at the logic component 302 to always halt, e.g., stop or pause, a PIM command operation associated with an earlier PIM request. According to another example policy, the arbitration circuitry 339 may be configured to detect whether a threshold number or type of DRAM requests are received at the logic component 302 within a particular time window, e.g., within a particular number of packet frames, clock cycles, etc., after a PIM request is received at the logic component 302. In such an example policy, if a threshold number or type of DRAM requests are received at the logic component 302 within the particular time window, then the arbitration circuitry 339 may be configured to stop or hold PIM command request execution associated with an earlier PIM request until after performance of the DRAM request later received at the logic component 302. Alternatively, in another example policy the arbitration circuitry 339 may be configured to give priority to certain or all PIM requests received at the logic component 302 over certain or all DRAM requests received at the logic component 302. Embodiments are not limited to these examples.

Further, the apparatus and methods described herein provide embodiments that are not constrained to the control of normal control registers, e.g., double data rate (DDR) timing control registers, associated with memory arrays, e.g., DRAM arrays. Instead, the timing circuitry 333 in the memory component 301 is configured for logical operations on PIM capable logic/memory devices 305 and 307 separate from the normal control registers shown as 136 in FIG. 1. Additionally, as shown in the example embodiments of FIGS. 3A and 3B, the control logic 331 and the sequencer 332 may be variously located between the logic component 302 and the memory component 301 to achieve PIM capable logic/memory devices 305 and 307 which can perform logical operations described in more detail in connection with FIGS. 6-8.

One example expanding on the manner in which logic that is variously partitioned between a memory component and a logic component can advantageously facilitate and/or enhance integration with one or more separate host processing resources is illustrated in the case of maintaining cache coherency. For example, the partitioned logic 325 can, in at least one embodiment, maintain cache coherency between the logic component 302 and the memory component 301.

In this example, the partitioned logic 325 may be configured to create a block select as metadata to a cache line and to create a subrow select as metadata to the cache line. The partitioned logic 325 may be in the form of hardware, software and/or firmware, but at least hardware in the form of circuitry to execute instructions and/or perform logical operations. In this example, the partitioned logic 325 is configured to create and use the block select metadata to enable an offset to a cache line associated with a separate host. The partitioned logic 325 is further configured to create and use the subrow select to enable multiple sets to set associative cache used by a separate host. In at least one embodiment, the block select may provide an offset to a page in a dynamic random access memory (DRAM). Additionally, in some embodiments, the partitioned logic 325 of the logic component 302 that is coupled to the memory component 301 may be configured to generate a bulk invalidate command to a cache memory upon receipt of a bit vector operation instruction.

PIM capable device operations can use bit vector based operations. As used herein, the term "bit vector" is intended to mean a physically contiguous number of bits on a bit vector memory device, e.g., PIM device, whether physically contiguous in rows (e.g., horizontally oriented) or columns (e.g., vertically oriented) in an array of memory cells. Thus, as used herein a "bit vector operation" is intended to mean an operation that is performed on a bit-vector that is a contiguous portion (also referred to as "chunk") of virtual address space, e.g., used by a PIM device. For example, a chunk of virtual address space may have a bit length of 256 bits. A chunk may or may not be contiguous physically to other chunks in the virtual address space. As used herein, the term "bulk" is intended to mean a capability to address and operate on information in multiple locations, e.g., multiple cache lines, without having to separately address and communicate instructions to each of the multiple locations.

In previous host based cache architecture approaches (whether fully associative, set associative, or direct mapped), the cache architecture uses part of an address generated by a processor associated with a host to locate the placement of a block in the cache and may have some metadata (e.g., valid and dirty bits) describing the state of the cache block. This is because processing resources should have the same view of memory. Accordingly, a cache based memory system will use some form of cache coherency protocol, e.g., either a MESI (modified, exclusive, shared, invalid) or directory based cache coherency protocol, to maintain access to accurate data in the cache memory system between processing resources.

In previous host based approaches a last level cache architecture may be constructed for intended use with a 3D integrated memory, with tags and meta data being stored on-chip in SRAM and the block data being stored in quickly accessed DRAM. In such an architecture, the matching occurs using the on-chip SRAM tags and the memory access is accelerated by the relatively fast on-package DRAM (as compared to an off-package solution).

In PIM capable devices, microcode instructions executing on a processing resource may want to access an array of the PIM capable device to perform a bit vector based operation. A processing resource associated with a host may only be aware of the host's cache line bit length for use in maintaining cache coherency on the host. However, as noted, a bit vector based operation in a PIM capable device may operate on bit vectors of a much different bit length. A typical use pattern for performing a bit vector based operation and maintaining cache coherency in software may involve expensive flushing of an entire cache or marking particular pages as "uncacheable". To make a PIM capable device cache coherency protocol aware to a level equivalent to that of a host would be very costly and complex in terms of hardware and software device space usage and design development time. Further, even if this were done for a cache coherency protocol of a particular host platform, the PIM capable device would not be cache coherency protocol aware for hosts of different platforms using different cache coherency protocols.

In contrast, according to various embodiments such as described in FIGS. 3A and 3B, the partitioned logic 325 can include hardware, e.g., in the form of an application specific integrated circuit (ASIC), configured to and can operate on more compactly designed microcode instructions in the form of firmware, e.g., 32 or 64 bit microcode instructions stored in array 330 and executed by the control logic 331. According to embodiments, the partitioned logic 325 may include an invalidate engine (not shown) associated with the control logic 331. In this manner, the control logic 331 may be configured for a particular cache coherency protocol associated with a host's cache memory using particularly designed firmware to implement particular PIM operations at a significantly lower costs that that which would be required by hardware and software which fully replicated a host cache coherency protocol. Thus, in some embodiments, the control logic 331 in the partitioned logic 325 may be configured to recognize the above described block select and the subrow select metadata and use that metadata to provide a compute enabled cache.

For example, in logic/memory device embodiments 305 and 307, memory banks 321 on the memory component 301 may have independent I/O paths, e.g., TSVs, coupling to the control logic 331 of the logic component 302 and may be controlled explicitly by the partitioned logic 325 on the logic component 302. In this manner cache blocks on a logic component 302 may be moved from an SRAM in the logic component 302 into a DRAM array in a bank 321 on the memory component 301. The placement of the cache blocks may be controlled using the metadata data structures created and added to the host cache lines by the control logic 331 of the partitioned logic 325 on the logic component 302.

In at least one embodiment, the block select and subrow select metadata data structures, created by the control logic 331 on the logic component 302, may be data structures internal to the logic/memory device embodiments 305 and 307, e.g., stored and maintained between the logic component 302 and memory component 301 and not stored, maintained or tracked as part of an address to the processing resources on a host, e.g., host 110 in FIG. 1. Again, control logic 331 on the partitioned logic 325 on the logic component 302 is at least hardware configured to execute microcoded instructions. In this manner, the control logic 331 may be configured to change the block select and the subrow select, as needed, and be configured to relocate the cache block data transparently to the processing resources of a host. Alternatively, however, the control logic 325 can additionally be configured to store and maintain a copy of the block select and subrow select metadata structures with processing resources of a separate host. Embodiments are not limited to the example given herein.

FIG. 4 illustrates an example of a system on a chip (SoC) 400 having a plurality of adjacent and coupled memory components 401-1, 401-2, . . . , 401-N (referred to collectively as 401) which are further coupled to a logic component 402. According to various embodiments the plurality of adjacent and coupled memory components 401-1, . . . , 401-N may be in the form of a plurality of individual memory die and/or distinct memory layers formed as integrated circuits on a chip. The plurality of memory components 401 can further be partitioned into distinct portions 421 of the plurality of memory components 401, e.g., partitioned into separate and distinct dynamic random access memory (DRAM) banks on each memory component 401.

Similarly, the logic component 402 may be in the form of an individual logic die and/or distinct logic layers formed as integrated circuits on a chip. In this example, the SoC 400 provides three dimensions (3D) by stacking the plurality of memory components 401 and interconnecting at least one memory component 401-1, . . . , 401-N and to a logic component 402 to collectively form a logic/memory device 420. The plurality of memory components 401-1, . . . , 401-N can be coupled to the logic component 402 using I/O paths, e.g., through silicon vias (TSVs) (not shown). The manner in which TSVs, either entirely or partially through silicon or other single, composite and/or doped substrate material, may be used to interconnect the components is well understood.

As used herein an apparatus is intended to mean one or more components, devices and/or systems which may be coupled to achieve a particular function. A system, as used herein, is intended to mean a collection of devices coupled together, whether in wired or wireless fashion, to form a larger network, e.g., as in a distributed computing network. A component, as used herein, is intended to mean a die, substrate, layer, and/or integrated circuitry. As used herein, a device may be formed within or among components. Thus, as used herein, a "device" such as a memory device may be wholly within a memory component. Additionally, however, a device such as a logic/memory device is intended to mean some combination of logic and memory components. According to embodiments, a memory device, logic device, and/or logic/memory device all include devices able to perform a logical operation, e.g., an apparatus able to perform a Boolean logical operation.

TSV manufacturing techniques enable interconnection of multiple die layers in order to construct three-dimensional dies. This ability to interconnect multiple die layers permits building a memory device with a combination of memory storage layers and one or more logic layers. In this manner, the device provides the physical memory storage and logical memory transaction processing in a single electronic device package. The arrangement shown in FIG. 4 is to illustrate an example configuration. Embodiments described herein, however, are not limited to this example and/or a particular die/layer arrangement.

The SoC 400 example shown in FIG. 4 may provide a very compact and power efficient package with available bandwidth capacity of 320 GB/s per device. The illustrated SoC 400 may be capable of high bandwidth via a hierarchical and parallel approach to the design. A device hierarchy may occur across the logic and memory components and hardware parallelism may occur in a planar manner across a given component.

In the example of FIG. 4, a combination and/or organization of logic and memory resources between the plurality of memory components 401-1, . . . , 401-N and one or more logic components 402 for the SoC 400 may be referred to as a logic/memory device 420. Through-silicon vias (TSVs) may interconnect each of the memory components 401-1, . . . , 401-N and one or more logic components 402, e.g., die and/or layers for each logic/memory device 420. In the illustration of FIG. 4, the SoC 400 is shown organized into sixteen (16) logic/memory devices 420 with each device associated with at least a portion of the logic component 402 and a portion of one or more of the plurality of memory components 401-1, . . . , 401-N. Embodiments, however, are not limited to this example. Embodiments can include geometric and/or numerical configurations different from that described and illustrated in FIG. 4.

Figure 5A:
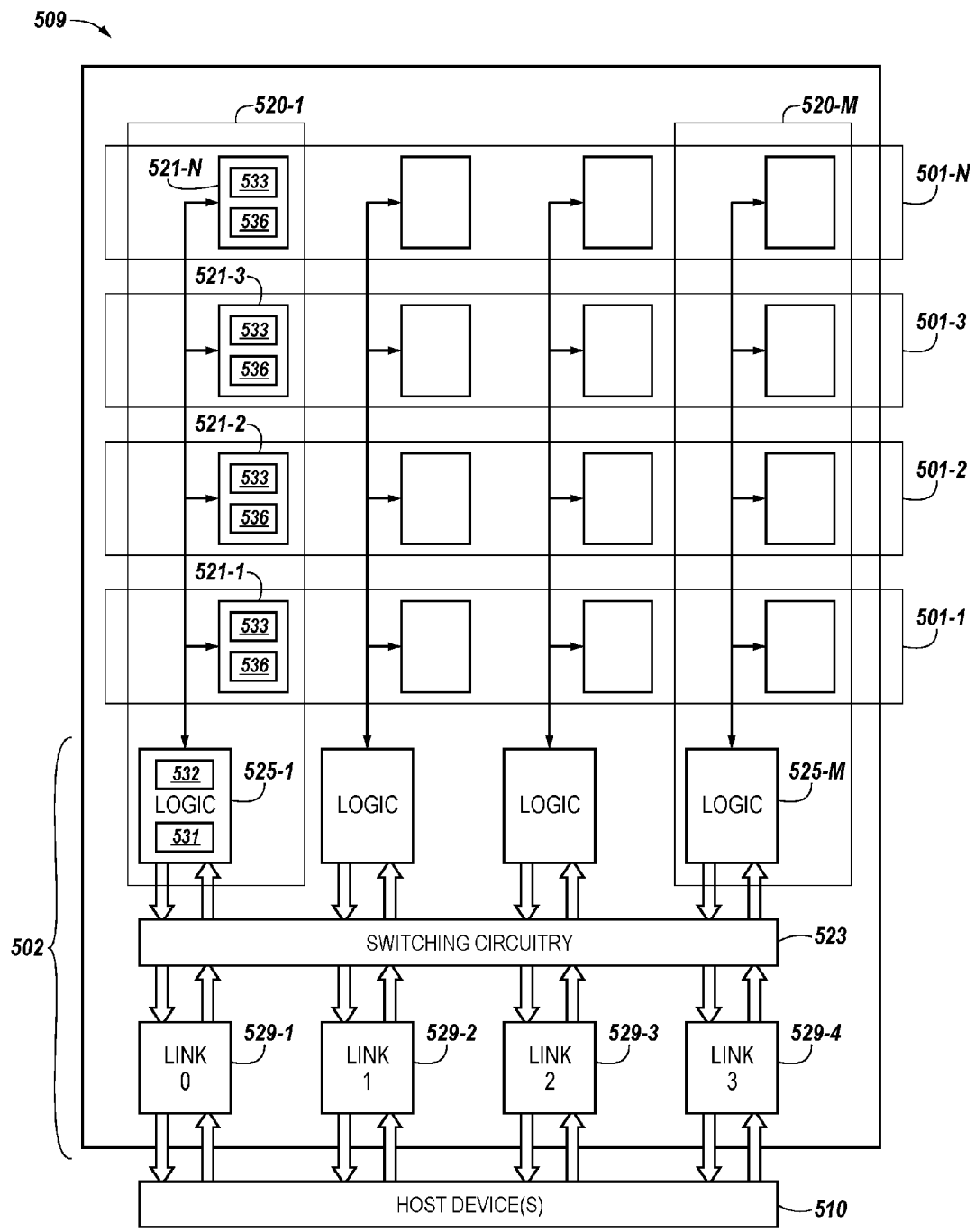
FIG. 5A is a block diagram illustrating a quadrant of a computing system in accordance with a number of embodiments of the present disclosure.

FIG. 5A is a block diagram illustrating in two-dimensions an embodiment of a quadrant 509 of SoC 400 shown in FIG. 4. FIG. 5B is a block diagram illustrating in two-dimensions another embodiment of a quadrant 511 of SoC 400 shown in FIG. 4. In these example illustrations, four logic/memory devices 520-1, . . . , 520-M are shown (each logic/memory device generally referred to as 520) with each logic/memory device 520 including a partitioned portion 521-1, . . . , 521-N (e.g., particular memory banks) of the plurality of adjacent and coupled memory components 501-1, . . . , 501-N and at least a partitioned portion 525-1 (e.g., particular logic) of the one or more logic components 502. As shown, at least one logic component 502 is adjacent to and coupled to the plurality of memory components 501-1, . . . , 501-N.

According to various embodiments, at least a portion of a logic component 502 may be partitioned in relation to a logic/memory device 520. For example, each logic/memory device 520 may include separate logic 525-1, . . . , 525-M (also referred to as "partitioned logic" or "second partitioned logic" in relation to location on the logic component 502) which is a partitioned portion of the logic component 502 relative to a particular logic/memory device 520-1, . . . , 520-M. As shown in the embodiment of FIG. 5A, each partitioned logic 525-1, . . . , 525-M (generally referred to as 525) includes control logic 531 and sequencer 532 to form a PIM capable logic/memory device 520 with timing circuitry 533 in the partitioned portions 521-1, . . . , 521-N of the plurality of memory components 501-1, . . . , 501-N. Control logic 531 and sequencer 532 may represent the control logic 231/331 and sequencer 232/332 shown in FIGS. 2, 3A and 3B. Timing circuitry 533 is shown separate and distinct from the normal control registers and timing circuitry 536, e.g., DDR control registers and timing circuitry, which may be used for the partitioned portions 521-1, . . . , 521-N of the plurality of memory components 501-1, . . . , 501-N. The timing circuitry 533 may represent the timing circuitry 233/333 shown in FIGS. 2, 3A and 3B and the normal control registers and timing circuitry 536 may represent the registers 136 shown in FIG. 1.

According to various embodiments, partitioned logic 525 may manage memory reference operations for a logic/memory device 520. For example, partitioned logic 525 may provide access to one or more partitioned portions 521-1, . . . , 521-M (e.g., particular memory banks) of the plurality of memory components 501-1, . . . , 501-N. The partitioned portions 521-1, . . . , 521-N of the plurality of memory components 501-1, . . . , 501-N may permit memory transactions to exist in parallel not only across partitioned portions 521-1, . . . , 521-N of the memory components 501-1, . . . , 501-N within a target logic/memory device 520-1, but also in parallel across logic/memory devices 520-1, . . . , 520-M.

The partitioned logic 525-1, . . . , 525-M of a logic component 502 may be in the form of control logic, state machine, etc. The partitioned logic 525-1, . . . , 525-M may be in the form of hardware and firmware to implement functions described herein.

Figure 5B:
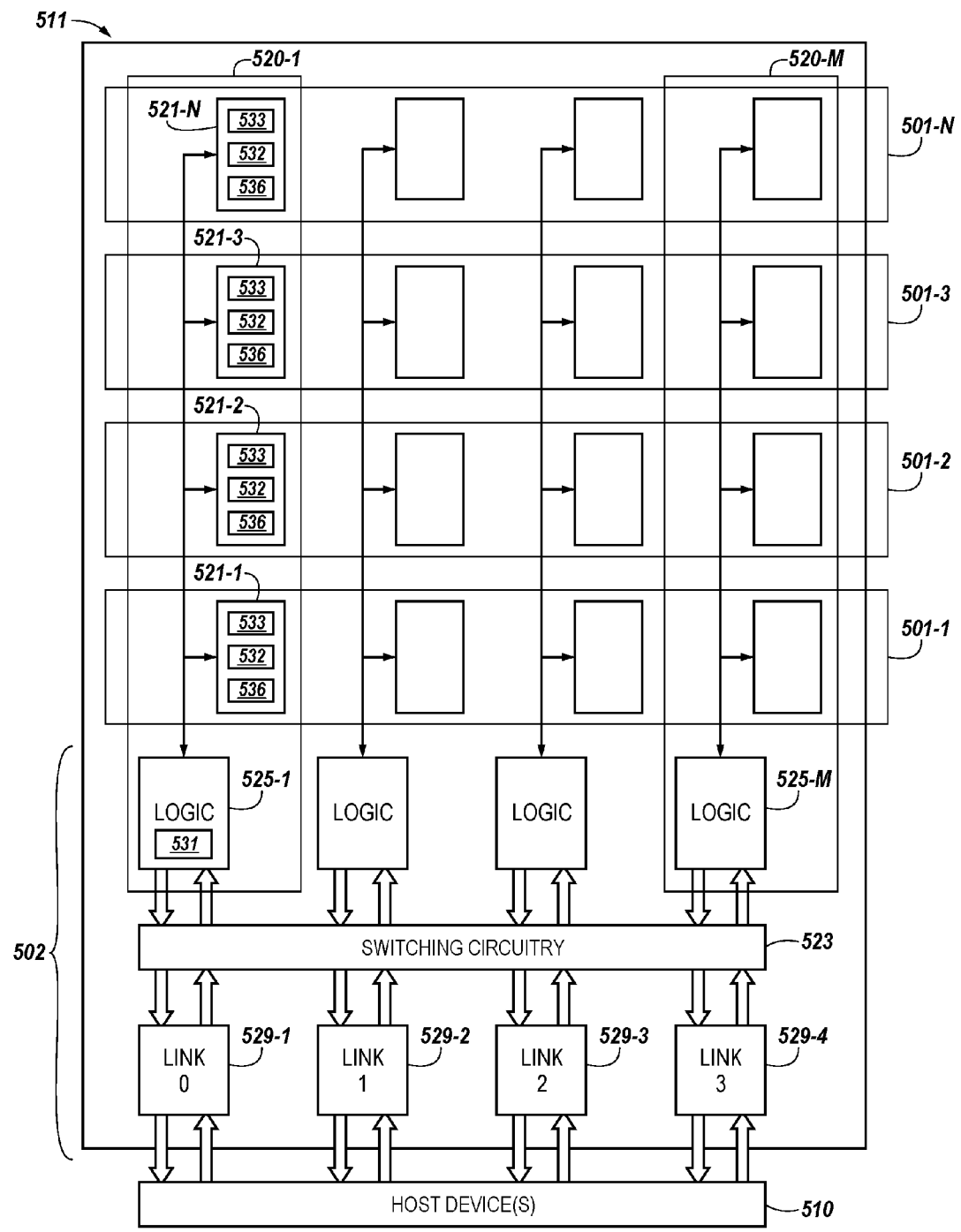
FIG. 5B is another block diagram illustrating a quadrant of a computing system in accordance with a number of embodiments of the present disclosure.

In the embodiments of FIGS. 5A and 5B, the partitioned logic, 525-1, . . . , 525-M of a logic component 502 includes at least control logic 531 (shown as 331 in FIGS. 3A and 3B). In the embodiment of FIG. 5A, a sequencer 532 (shown as 332 in FIG. 3A) for each logic/memory device 520 is also included on the logic component 502 to form a processing in memory (PIM) capable logic/memory device 520. However, in the embodiment of FIG. 5B, a sequencer 532 (shown as 332 in FIG. 3B) for each logic/memory device 520 is provided on each portion 521-1, . . . , 521-N of the plurality of memory components 501-1, . . . , 501-N to form a PIM capable logic/memory device 520. As described in connection with FIGS. 3A and 3B, the control logic 531 may be in the form of a microcoded engine which can execute microcode instructions. As used herein, an engine is intended to mean hardware and/or software, but at least hardware in the form of transistor circuitry and/or an application specific integrated circuit (ASIC). In some embodiments, the sequencer 532 may also be in the form of a microcoded engine.

As shown in the example embodiments of FIGS. 5A and 5B, the logic component 502 may include external input/output (I/O) link access, e.g., links 529-1, . . . , 529-4, to the logic/memory devices 520 as well as internal switching circuitry 523. The external I/O links, e.g., links 529-1, . . . , 529-4 (generally referred to as 529), may be provided by four, eight, or more logical links. In the example in FIG. 5, four links 529-1, . . . , 529-4 (Link 0, Link 1, Link 2, and Link 3) are shown coupled to switching circuitry 523. The switching circuitry 523 may direct transactions among a plurality of logic/memory devices 520, e.g., to partitioned logic 525-1, . . . , 525-M associated with the portions 521-1, . . . , 521-N of the plurality of memory components 501-1, . . . , 501-N.

The links 529 may support the ability to couple logic/memory devices 520 to both hosts 510 or other network devices. This coupling can facilitate the construction of memory subsystems with capacities larger than a single logic/memory device 520 while not perturbing native link structures and packetized transaction protocols. Links 529 can be configured as host device links or pass-through links in a multitude of topologies. In example, four potential device topologies based upon the example four-link configuration can be configured in a network topology. These four potential device topologies include mesh, torus and/or crossbar topologies. Chaining multiple logic/memory devices 520 together can increase a total memory capacity available to a host 510.

In the example embodiments of FIGS. 5A and 5B, the partitioned logic 525 of the logic component 502 for a device 520 may include direct inline memory module (DIMM) control logic 531 for each independent device 520. In the example embodiments of FIGS. 5A and 5B, four partitioned logic sets are shown, e.g., 525-1, . . . , 525-M, each associated with a particular device 520. Each partitioned logic 525-1, . . . , 525-M may be loosely associated with a link 529-1, . . . , 529-4. In this manner, one or more host(s) 510 may have the ability to minimize bandwidth latency through the logic component 502 by logically sending request packets to links 529 physically closest to the associated partitioned logic 525 of a particular device 520.

In one or more embodiments, partitioned portions 521-1, 521-2, . . . , 521-N (generally referred to as 521) of the plurality of memory components 501-1, . . . , 501-N within a target device 520 may be broken into banks of dynamic random access memories (DRAMs). In this example, access through stacked memory components 501-1, . . . , 501-N may access a particular memory bank, e.g., DRAM bank. In an example embodiment where memory components 501-1, . . . , 501-N are separate die and/or distinct memory layers, lower banks, e.g., 521-1, can be configured in lower die and/or layers, e.g., 501-1, while higher banks, e.g., 521-2, . . . , 521-N, can be configured in higher die and/or layers, e.g., 501-2, . . . , 501-N. A DRAM bank may be organized using rows and columns with 16K columns and 512 rows. Thus, in the example embodiments of FIGS. 5A and 5B, partitioned logic 525-1, . . . , 525-M may organize DRAM into one megabit (1 Mb) blocks each addressing 16-bytes. Read or write requests to a partitioned portions 521-1, . . . , 521-N of the plurality of memory components 501-1, . . . , 501-N can be performed in 32-bytes for each column fetch.

In this example, partitioned logic 525 including control logic 531 associated with a plurality of banks 521-1, . . . , 521-N for a given logic/memory device 520 can decode signals received from a host 510. According to various embodiments, these signals can include chip enable signals, write enable signals, debugging indication signals, and address latch signals that are used to control DRAM bank operations, including traditional data read, data write, and data erase operations as well as logical Boolean AND, OR, XOR, etc. operations performed with the memory arrays and/or sensing circuitry to a PIM capable DRAM bank. Thus, partitioned logic 525 may be responsible for executing instructions from a host 510 for a PIM capable logic/memory device 520.

In the embodiment of FIG. 5A the partitioned logic 525 of the logic component 502 includes control logic 531 and a sequencer 532 and the partitioned portions 521-1, . . . , 521-N of the plurality of memory components 501-1, . . . , 501-N include timing circuitry 533, separate from traditional DDR control registers 536, associated with a PIM capable logic/memory device 520 to perform logical operations.

In the embodiment of FIG. 5B the partitioned logic 525 of the logic component 502 includes control logic 531 and the partitioned portions 521-1, . . . , 521-N of the plurality of memory components 501-1, . . . , 501-N include a sequencer 532 and timing circuitry 533, separate from traditional DDR control registers 536, associated with a PIM capable logic/memory device 520 to perform logical operations.

Figure 6:
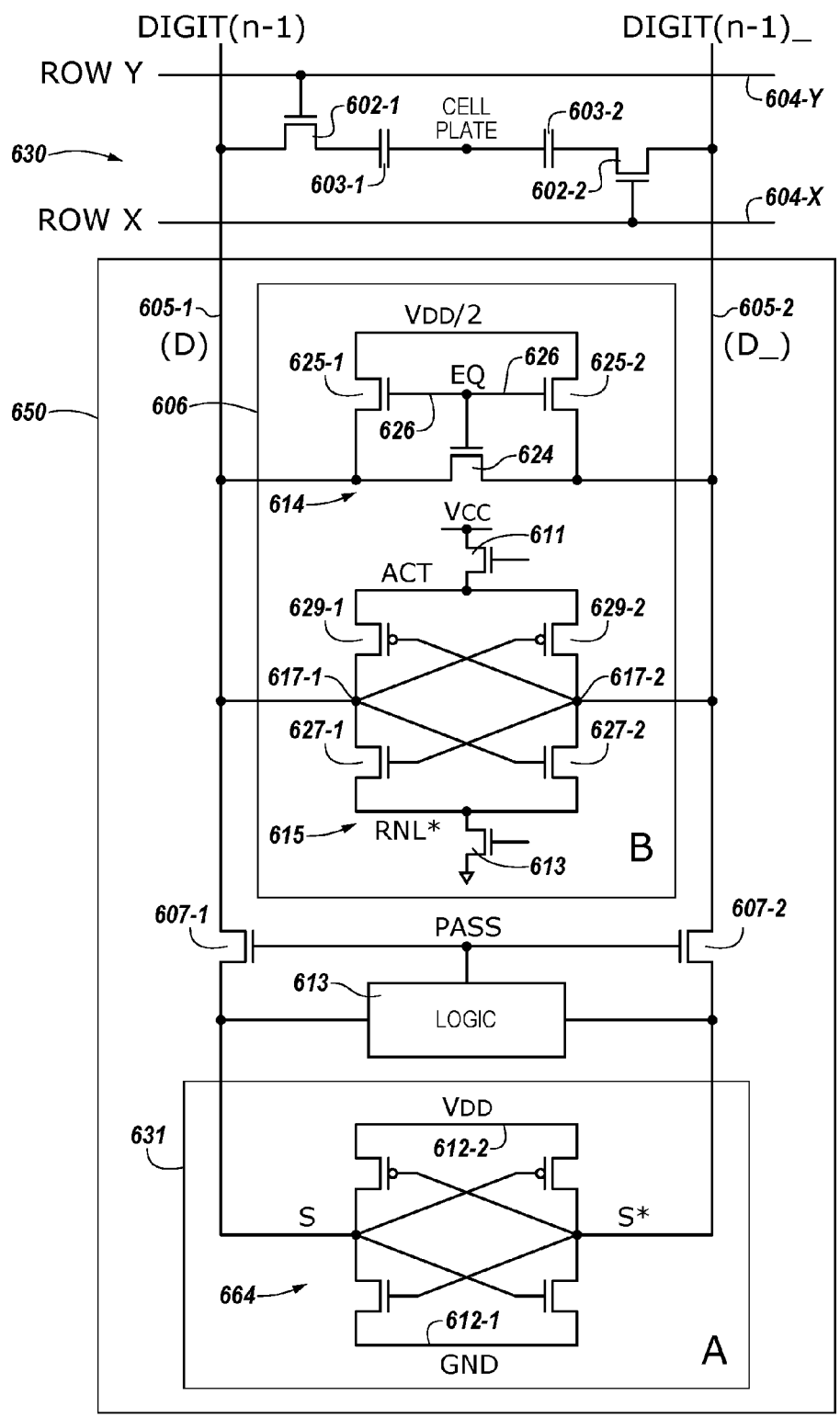
FIG. 6 is a schematic diagram illustrating sensing circuitry to a memory device in accordance with a number of embodiments of the present disclosure.
Figure 7:
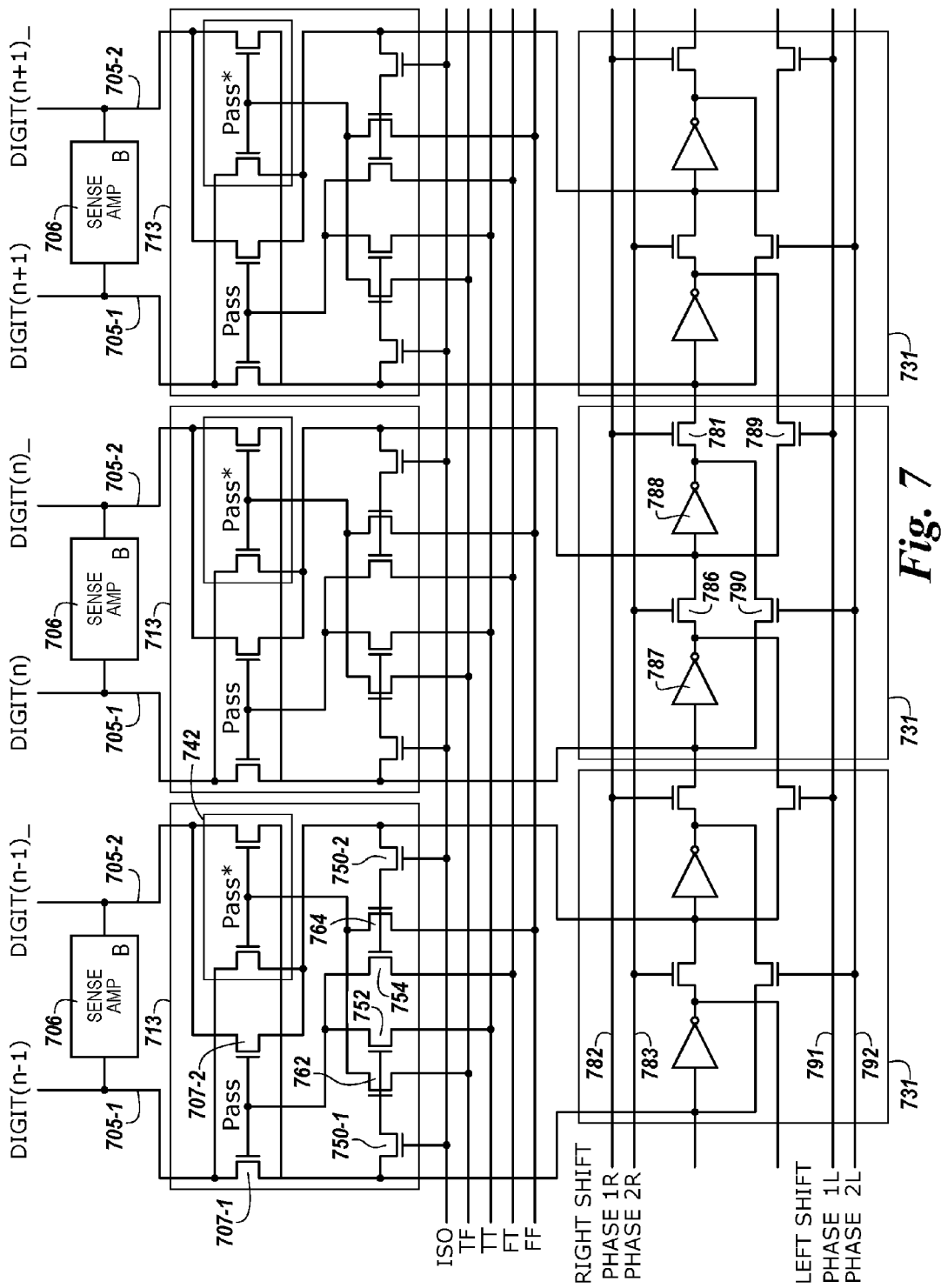
FIG. 7 is a schematic diagram illustrating sensing circuitry to a memory device in accordance with a number of embodiments of the present disclosure.

According to various embodiments, and as described in more detail in the examples of FIGS. 6-8, the logic/memory devices described in FIGS. 3A-5B may be configured to execute of PIM commands to control sensing circuitry including compute components shown as 631 in FIGS. 6 and 731 in FIG. 7, to implement logical functions such as AND, OR, NOT, NAND, NOR, and XOR logical functions. Additionally the logic/memory devices described in FIGS. 3A-5B may be configured to control the sensing circuitry to perform non-Boolean logic operations, including copy, compare and erase operations, as part of executing DRAM requests. Thus, one or more logical functions of the controller 240 to a PIM capable device described in connection with FIG. 2 may be partitioned between a plurality of memory components and one or more logic components to a logic/memory device.

FIG. 6 is a schematic diagram illustrating sensing circuitry 650 in accordance with a number of embodiments of the present disclosure. The sensing circuitry 650 can represent the sensing circuitry 150 shown in FIG. 1. In FIG. 6, a memory cell comprises a storage element (e.g., capacitor) and an access device (e.g., transistor). For instance, a first memory cell comprises transistor 602-1 and capacitor 603-1, and a second memory cell comprises transistor 602-2 and capacitor 603-2, etc. In this example, the memory array 630 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 630 can be arranged in rows coupled by word lines 604-X (Row X), 604-Y (Row Y), etc., and columns coupled by pairs of complementary sense lines (e.g., data lines DIGIT(n−1)/DIGIT(n−1)_, DIGIT(n)/DIGIT(n)_, DIGIT(n+1)/DIGIT(n+1)_). The individual sense lines corresponding to each pair of complementary sense lines can also be referred to as data lines 605-1 (D) and 605-2 (D_) respectively. Although only one pair of complementary data lines are shown in FIG. 6, embodiments of the present disclosure are not so limited, and an array of memory cells can include additional columns of memory cells and/or data lines (e.g., 4,096, 8,192, 16,384 data lines, etc.).

Memory cells can be coupled to different data lines and/or word lines. For example, a first source/drain region of a transistor 602-1 can be coupled to data line 605-1 (D), a second source/drain region of transistor 602-1 can be coupled to capacitor 603-1, and a gate of a transistor 602-1 can be coupled to word line 604-Y. A first source/drain region of a transistor 602-2 can be coupled to data line 605-2 (D_), a second source/drain region of transistor 602-2 can be coupled to capacitor 603-2, and a gate of a transistor 602-2 can be coupled to word line 604-X. The cell plate, as shown in FIG. 6, can be coupled to each of capacitors 603-1 and 603-2. The cell plate can be a common node to which a reference voltage (e.g., ground) can be applied in various memory array configurations.

The memory array 630 is coupled to sensing circuitry 650 in accordance with a number of embodiments of the present disclosure. In this example, the sensing circuitry 650 comprises a sense amplifier 606 and a compute component 631 corresponding to respective columns of memory cells (e.g., coupled to respective pairs of complementary data lines). The sense amplifier 606 can be coupled to the pair of complementary sense lines 605-1 and 605-2. The compute component 631 can be coupled to the sense amplifier 606 via pass gates 607-1 and 607-2. The gates of the pass gates 607-1 and 607-2 can be coupled to logical operation selection logic 613.

The logical operation selection logic 613 can be configured to include pass gate logic for controlling pass gates that couple the pair of complementary sense lines un-transposed between the sense amplifier 606 and the compute component 631 and/or swap gate logic for controlling swap gates that couple the pair of complementary sense lines transposed between the sense amplifier 606 and the compute component 631. The logical operation selection logic 613 can also be coupled to the pair of complementary sense lines 605-1 and 605-2. The logical operation selection logic 613 can be configured to control continuity of pass gates 607-1 and 607-2 based on a selected logical operation, as described in detail below for various configurations of the logical operation selection logic 613.

The sense amplifier 606 can be operated to determine a data value (e.g., logic state) stored in a selected memory cell. The sense amplifier 606 can comprise a cross coupled latch, which can be referred to herein as a primary latch. In the example illustrated in FIG. 6, the circuitry corresponding to sense amplifier 606 comprises a latch 615 including four transistors coupled to a pair of complementary data lines D 605-1 and D_ 605-2. However, embodiments are not limited to this example. The latch 615 can be a cross coupled latch (e.g., gates of a pair of transistors, such as n-channel transistors (e.g., NMOS transistors) 627-1 and 627-2 are cross coupled with the gates of another pair of transistors, such as p-channel transistors (e.g., PMOS transistors) 629-1 and 629-2). The cross coupled latch 615 comprising transistors 627-1, 627-2, 629-1, and 629-2 can be referred to as a primary latch.

In operation, when a memory cell is being sensed (e.g., read), the voltage on one of the data lines 605-1 (D) or 605-2 (D_) will be slightly greater than the voltage on the other one of data lines 605-1 (D) or 605-2 (D_). An ACT signal and the RNL* signal can be driven low to enable (e.g., fire) the sense amplifier 606. The data lines 605-1 (D) or 605-2 (D_) having the lower voltage will turn on one of the PMOS transistor 629-1 or 629-2 to a greater extent than the other of PMOS transistor 629-1 or 629-2, thereby driving high the data line 605-1 (D) or 605-2 (D_) having the higher voltage to a greater extent than the other data line 605-1 (D) or 605-2 (D_) is driven high.

Similarly, the data line 605-1 (D) or 605-2 (D_) having the higher voltage will turn on one of the NMOS transistor 627-1 or 627-2 to a greater extent than the other of the NMOS transistor 627-1 or 627-2, thereby driving low the data line 605-1 (D) or 605-2 (D_) having the lower voltage to a greater extent than the other data line 605-1 (D) or 605-2 (D_) is driven low. As a result, after a short delay, the data line 605-1 (D) or 605-2 (D_) having the slightly greater voltage is driven to the voltage of the supply voltage $V_{CC}$ through source transistor 611, and the other data line 605-1 (D) or 605-2 (D_) is driven to the voltage of the reference voltage (e.g., ground) through the sink transistor 613. Therefore, the cross coupled NMOS transistors 627-1 and 627-2 and PMOS transistors 629-1 and 629-2 serve as a sense amplifier pair, which amplify the differential voltage on the data lines 605-1 (D) and 605-2 (D_) and operate to latch a data value sensed from the selected memory cell.

Embodiments are not limited to the sense amplifier 606 configuration illustrated in FIG. 6. As an example, the sense amplifier 606 can be current-mode sense amplifier and/or single-ended sense amplifier (e.g., sense amplifier coupled to one data line). Also, embodiments of the present disclosure are not limited to a folded data line architecture such as that shown in FIG. 6.

The sense amplifier 606 can, in conjunction with the compute component 631, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The sense amplifier 606 can further include equilibration circuitry 614, which can be configured to equilibrate the data lines 605-1 (D) and 605-2 (D_). In this example, the equilibration circuitry 614 comprises a transistor 624 coupled between data lines 605-1 (D) and 605-2 (D_). The equilibration circuitry 614 also comprises transistors 625-1 and 625-2 each having a first source/drain region coupled to an equilibration voltage (e.g., $V_{DD}/2$), where $V_{DD}$ is a supply voltage associated with the array. A second source/drain region of transistor 625-1 can be coupled data line 605-1 (D), and a second source/drain region of transistor 625-2 can be coupled data line 605-2 (D_). Gates of transistors 624, 625-1, and 625-2 can be coupled together, and to an equilibration (EQ) control signal line 626. As such, activating EQ enables the transistors 624, 625-1, and 625-2, which effectively shorts data lines 605-1 (D) and 605-2 (D_) together and to the an equilibration voltage (e.g., $V_{DD}/2$).

Although FIG. 6 shows sense amplifier 606 comprising the equilibration circuitry 614, embodiments are not so limited, and the equilibration circuitry 614 may be implemented discretely from the sense amplifier 606, implemented in a different configuration than that shown in FIG. 6, or not implemented at all.

As described further below, in a number of embodiments, the sensing circuitry (e.g., sense amplifier 606 and compute component 631) can be operated to perform a selected logical operation and initially store the result in one of the sense amplifier 606 or the compute component 631 without transferring data from the sensing circuitry via an I/O line (e.g., without performing a data line address access via activation of a column decode signal).

Performance of logical operations (e.g., Boolean logical functions involving data values) is fundamental and commonly used. Boolean logic functions are used in many higher level functions. Consequently, speed and/or power efficiencies that can be realized with improved logical operations, can translate into speed and/or power efficiencies of higher order functionalities.

As shown in FIG. 6, the compute component 631 can also comprise a latch, which can be referred to herein as a secondary latch 664. The secondary latch 664 can be configured and operated in a manner similar to that described above with respect to the primary latch 615, with the exception that the pair of cross coupled p-channel transistors (e.g., PMOS transistors) of the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 6 at 631, and various other embodiments are described further below.

FIG. 7 is a schematic diagram illustrating sensing circuitry capable of implementing an XOR logical operation in accordance with a number of embodiments of the present disclosure. FIG. 7 shows a sense amplifier 706 coupled to a pair of complementary sense lines 705-1 and 705-2, logical operation select logic 713, and a compute component 731 coupled to the sense amplifier 706 via pass gates 707-1 and 707-2. The sense amplifier 706 shown in FIG. 7 can correspond to sense amplifier 606 shown in FIG. 6. The compute component 731 shown in FIG. 7 can correspond to sensing circuitry, including compute component, 150 in FIG. 1. The logical operation selection logic 713 shown in FIG. 7 can correspond to logical operation selection logic 613 shown in FIG. 6. The gates of the pass gates 707-1 and 707-2 can be controlled by a logical operation selection logic 713 signal, (e.g., Pass). For example, an output of the logical operation selection logic 713 can be coupled to the gates of the pass gates 707-1 and 707-2. Further, the compute component 731 can comprise a loadable shift register configured to shift data values left and right.

According to the embodiment illustrated in FIG. 7, the compute components 731 can comprise respective stages (e.g., shift cells) of a loadable shift register configured to shift data values left and right. For example, as illustrated in FIG. 7, each compute component 731 (e.g., stage) of the shift register comprises a pair of right-shift transistors 781 and 786, a pair of left-shift transistors 789 and 790, and a pair of inverters 787 and 788. The signals PHASE 1R, PHASE 2R, PHASE 1L, and PHASE 2L can be applied to respective control lines 782, 783, 791 and 792 to enable/disable feedback on the latches of the corresponding compute components 731 in association with performing logical operations and/or shifting data in accordance with embodiments described herein.

The sensing circuitry shown in FIG. 7 shows operation selection logic 713 coupled to a number of logic selection control input control lines, including ISO, TF, TT, FT, and FF. Selection of a logical operation from a plurality of logical operations is determined from the condition of logic selection control signals on the logic selection control input lines, as well as the data values present on the pair of complementary sense lines 705-1 and 705-2 when isolation transistors 750-1 and 750-2 are enabled via an ISO control signal being asserted.

According to various embodiments, the operation selection logic 713 can include four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line. Gates of logic selection transistors 762 and 752 are coupled to the true sense line through isolation transistor 750-1 (having a gate coupled to an ISO signal control line). Gates of logic selection transistors 764 and 754 are coupled to the complementary sense line through isolation transistor 750-2 (also having a gate coupled to an ISO signal control line).

Data values present on the pair of complementary sense lines 705-1 and 705-2 can be loaded into the compute component 731 via the pass gates 707-1 and 707-2. The compute component 731 can comprise a loadable shift register. When the pass gates 707-1 and 707-2 are OPEN, data values on the pair of complementary sense lines 705-1 and 705-2 are passed to the compute component 731 and thereby loaded into the loadable shift register. The data values on the pair of complementary sense lines 705-1 and 705-2 can be the data value stored in the sense amplifier 706 when the sense amplifier is fired. In this example, the logical operation selection logic signal, Pass, is high to OPEN the pass gates 707-1 and 707-2.

The ISO, TF, TT, FT, and FF control signals can operate to select a logical function to implement based on the data value ("B") in the sense amplifier 706 and the data value ("A") in the compute component 731. In particular, the ISO, TF, TT, FT, and FF control signals are configured to select the logical function to implement independent from the data value present on the pair of complementary sense lines 705-1 and 705-2 (although the result of the implemented logical operation can be dependent on the data value present on the pair of complementary sense lines 705-1 and 705-2. For example, the ISO, TF, TT, FT, and FF control signals select the logical operation to implement directly since the data value present on the pair of complementary sense lines 705-1 and 705-2 is not passed through logic to operate the gates of the pass gates 707-1 and 707-2.

Additionally, FIG. 7 shows swap transistors 742 configured to swap the orientation of the pair of complementary sense lines 705-1 and 705-2 between the sense amplifier 706 and the compute component 731. When the swap transistors 742 are OPEN, data values on the pair of complementary sense lines 705-1 and 705-2 on the sense amplifier 706 side of the swap transistors 742 are oppositely-coupled to the pair of complementary sense lines 705-1 and 705-2 on the compute component 731 side of the swap transistors 742, and thereby loaded into the loadable shift register of the compute component 731.

The logical operation selection logic 713 signal Pass can be activated (e.g., high) to OPEN the pass gates 707-1 and 707-2 (e.g., conducting) when the ISO control signal line is activated and either the TT control signal is activated (e.g., high) with data value on the true sense line is "1" or the FT control signal is activated (e.g., high) with the data value on the complement sense line is "1."

The data value on the true sense line being a "1" OPENs logic selection transistors 752 and 762. The data value on the complimentary sense line being a "1" OPENs logic selection transistors 754 and 764. If the ISO control signal or either the respective TT/FT control signal or the data value on the corresponding sense line (e.g., sense line to which the gate of the particular logic selection transistor is coupled) is not high, then the pass gates 707-1 and 707-2 will not be OPENed by a particular logic selection transistor.

The logical operation selection logic signal Pass* can be activated (e.g., high) to OPEN the swap transistors 742 (e.g., conducting) when the ISO control signal line is activated and either the TF control signal is activated (e.g., high) with data value on the true sense line is "1," or the FF control signal is activated (e.g., high) with the data value on the complement sense line is "1." If either the respective control signal or the data value on the corresponding sense line (e.g., sense line to which the gate of the particular logic selection transistor is coupled) is not high, then the swap transistors 742 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 7 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 707-1 and 707-2 and swap transistors 742 to be OPEN at the same time, which shorts the pair of complementary sense lines 705-1 and 705-2 together. According to a number of embodiments of the present disclosure, the logical operations which can be implemented by the sensing circuitry illustrated in FIG. 7 can be the logical operations summarized in the logic tables shown in FIG. 8.

FIG. 8 is a logic table illustrating selectable logic operation results implemented by a sensing circuitry shown in FIG. 7 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 706 and compute component 731. The four control signals, in conjunction with a particular data value present on the complementary sense lines, controls the continuity of the pass gates 707-1 and 707-2 and swap transistors 742, which in turn affects the data value in the compute component 731 and/or sense amplifier 706 before/after firing. The capability to selectably control continuity of the swap transistors 742 facilitates implementing logical operations involving inverse data values (e.g., inverse operands and/or inverse result), among others.

Logic Table 8-1 illustrated in FIG. 8 shows the starting data value stored in the compute component 731 shown in column A at 844, and the starting data value stored in the sense amplifier 706 shown in column B at 845. The other 3 column headings in Logic Table 8-1 refer to the continuity of the pass gates 707-1 and 707-2, and the swap transistors 742, which can respectively be controlled to be OPEN or CLOSED depending on the state of the four logic selection control signals (e.g., TF, TT, FT, and FF), in conjunction with a particular data value present on the pair of complementary sense lines 705-1 and 705-2. The "Not Open" column corresponds to the pass gates 707-1 and 707-2 and the swap transistors 742 both being in a non-conducting condition, the "Open True" corresponds to the pass gates 707-1 and 707-2 being in a conducting condition, and the "Open Invert" corresponds to the swap transistors 742 being in a conducting condition. The configuration corresponding to the pass gates 707-1 and 707-2 and the swap transistors 742 both being in a conducting condition is not reflected in Logic Table 8-1 since this results in the sense lines being shorted together.

Via selective control of the continuity of the pass gates 707-1 and 707-2 and the swap transistors 742, each of the three columns of the upper portion of Logic Table 8-1 can be combined with each of the three columns of the lower portion of Logic Table 8-1 to provide 3×3=9 different result combinations, corresponding to nine different logical operations, as indicated by the various connecting paths shown at 875. The nine different selectable logical operations that can be implemented by the sensing circuitry (e.g., 550 in FIG. 5A) are summarized in Logic Table 8-2 illustrated in FIG. 8, including an XOR logical operation.

The columns of Logic Table 8-2 illustrated in FIG. 8 show a heading 880 that includes the state of logic selection control signals. For example, the state of a first logic selection control signal is provided in row 876, the state of a second logic selection control signal is provided in row 877, the state of a third logic selection control signal is provided in row 878, and the state of a fourth logic selection control signal is provided in row 879. The particular logical operation corresponding to the results is summarized in row 847.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a plurality of memory die adjacent to and coupled to one another;
   a logic die coupled to the plurality of memory die,
   wherein at least one memory die comprises a memory device, the memory device comprising:
      an array of memory cells;
      sensing circuitry coupled to the array, the sensing circuitry including a sense amplifier and a compute component; and
      timing circuitry coupled to the array and sensing circuitry, the timing circuitry configured to control timing of operations for the sensing circuitry; and
   wherein the logic die comprises:
      control logic coupled to the timing circuitry, the control logic configured to execute instructions to cause the sensing circuitry to perform the operations; and
      switching circuitry configured to:
         route memory array requests received from a host; and
         route processing in memory (PIM) requests received from the host to perform a logical operation using the sensing circuitry.

2. The apparatus of claim 1, wherein:
   the array of memory cells is a dynamic random access memory (DRAM) array;
   the timing circuitry is separate from double data rate (DDR) registers used to control read and write DRAM access requests for the array.

3. The apparatus of claim 1, wherein the timing circuitry and the control logic are in different clock domains and operate at different clock speeds.

4. The apparatus of claim 1, wherein the operations include logical AND, OR, and/or XOR Boolean operations.

5. The apparatus of claim 1, wherein the control logic includes a reduced instructions set computer (RISC) type controller which is configured to operate on PIM commands.

6. The apparatus of claim 1, wherein:
   the control logic is coupled to a sequencer on the logic die;
   the control logic is a microcoded engine; and
   wherein the control logic and the sequencer can execute microcode instructions and coordinate PIM operations on the logic die, respectively.

7. The apparatus of claim 6, wherein the timing circuitry is coupled to the control logic and is configured to control timing of logical operations using the sensing circuitry.

8. The apparatus of claim 1, wherein the logic die and the plurality of memory die comprise:
   a plurality of stacked dynamic random access memory (DRAM) memory die coupled to a logic die by through silicon vias (TSVs) to form a PIM device.

9. An apparatus, comprising:
   a plurality of memory die adjacent to and coupled to one another;
   a logic die coupled to the plurality of memory die;
   wherein each of the plurality of memory die comprise a plurality of partitioned banks, each bank comprising:
      an array of memory cells;
      sensing circuitry coupled to the array, the sensing circuitry including a sense amplifier and a compute component configured to perform operations; and
      timing circuitry coupled to the array and sensing circuitry to control timing of operations for the sensing circuitry; and
   wherein the logic die comprises:
      a plurality of partitioned logic each partitioned logic coupled to a subset of the plurality of partitioned banks to form a plurality of processing in memory (PIM) devices; and
      switching circuitry configured to:
         route memory array requests received from a host; and
         route PIM requests received from the host to perform a logical operation using the sensing circuitry.

10. The apparatus of claim 9, wherein each partitioned logic is configured to execute instructions to perform operations with the sensing circuitry.

11. The apparatus of claim 9, wherein each of the plurality of partitioned banks comprises a sequencer which has a microcoded engine to coordinate processing in memory (PIM) operations.

12. The apparatus of claim 9, wherein each partitioned logic comprises very large instruction word (VLIW) type controller which is configured to operate on processing in memory (PIM) commands.

13. The apparatus of claim 9, wherein:
   each of the plurality of partitioned banks is configured to execute a memory array access request; and
   each partitioned logic is configured to execute processing in memory (PIM) commands.

14. The apparatus of claim 13, wherein each of the plurality of partitioned banks is configured to perform logical operations using the sensing circuitry.

15. The apparatus of claim 14, wherein the logical operations comprise logical AND, OR and XOR operations using the sensing circuitry.

16. The apparatus of claim 9, wherein the logic die comprises an arbitration circuit, wherein the arbitration circuit is configured to:
   receive a PIM request from the host;
   receive a memory array request from the host; and
   schedule execution of the PIM and memory array requests according to a scheduling policy.

17. The apparatus of claim 16, wherein the scheduling policy is defined to give priority to memory array requests.

18. An apparatus, comprising:
a memory die, wherein the memory die comprise a plurality of partitioned banks, each bank comprising:
   a memory array;
   sensing circuitry coupled to the array, the sensing circuitry including sense amplifiers and a compute component configured to perform logical operations; and
   a first partitioned logic coupled to the array and sensing circuitry, the first partitioned logic configured to provide timing for the logical operations on the sensing circuitry; and
a logic die, wherein the logic die comprises a second partitioned logic coupled to the first partitioned logic and switching circuitry, and wherein:
   the logic die is configured to:
      receive processing in memory (PIM) requests from a host;
      execute microcode instructions to perform the logical operations; and
      apply a scheduling policy between received memory array requests and received PIM requests; and
   the switching circuitry is configured to:
      route memory array requests received from the host; and
      route the PIM requests received from the host to perform the logical operations using the sensing circuitry.

19. The apparatus of claim 18, wherein the logic die comprises a plurality of second partitioned logic, each second partitioned logic associated to at least one of the plurality of partitioned banks to form a processing in memory (PIM) device.

20. The apparatus of claim 18, wherein the first partitioned logic comprises a state machine to control timing of logical operation on the sensing circuitry.

21. The apparatus of claim 18, wherein the first partitioned logic on the memory die is configured to:
   retrieve microcode instructions; and
   sequence PIM operations.

22. The apparatus of claim 18, wherein the second partitioned logic comprises control logic to execute the microcode instructions to perform the logical operations.

23. The apparatus of claim 22, wherein the logical operations comprise logical AND, OR and XOR operations performed using the sensing circuitry.

24. The apparatus of claim 23 wherein the second partitioned logic comprises control logic to receive and to operate on memory array requests.

* * * * *